(12) United States Patent
Schulz-Harder et al.

(10) Patent No.: US 7,800,908 B2
(45) Date of Patent: Sep. 21, 2010

(54) DEVICE WITH A HEAT SOURCE FORMED BY A FUNCTION ELEMENT THAT IS TO BE COOLED, AT LEAST ONE HEAT SINK, AND AT LEAST ONE INTERMEDIATE LAYER LOCATED BETWEEN THE HEAT SOURCE AND THE HEAT SINK

(75) Inventors: Jurgen Schulz-Harder, Lauf (DE); Ernst Hammel, Vienna (AT)

(73) Assignees: Curamik Electronics GmbH, Eschenbach (DE); Electrovac AG, Klosterneuberg (DE)

( * ) Notice: Subject to any disclaimer, the term of this patent is extended or adjusted under 35 U.S.C. 154(b) by 709 days.

(21) Appl. No.: 10/561,433

(22) PCT Filed: Jun. 2, 2004

(86) PCT No.: PCT/DE2004/001115

§ 371 (c)(1),
(2), (4) Date: Dec. 19, 2005

(87) PCT Pub. No.: WO2004/067362

PCT Pub. Date: Aug. 12, 2004

(65) Prior Publication Data

US 2007/0091572 A1    Apr. 26, 2007

(30) Foreign Application Priority Data

Jun. 17, 2003  (DE) ................. 103 27 530

(51) Int. Cl.
*H05K 7/20* (2006.01)
(52) U.S. Cl. .................. 361/708; 361/704; 428/408; 428/364; 165/185

(58) Field of Classification Search .................. 361/220, 361/226, 704–710, 717–719; 428/209, 408; 165/185; 257/E23.11, 675, E23.103; 174/16.3; 374/161
See application file for complete search history.

(56) References Cited

U.S. PATENT DOCUMENTS 5,965,267 A    10/1999    Nolan et al.

(Continued)

FOREIGN PATENT DOCUMENTS

EP    1 199 328    4/2002

(Continued)

OTHER PUBLICATIONS

Hone J. et al: "Thermal properties of carbon nanotubes and nanotube-based materials" Applied Physics A: Materials Science and Processing, Springer Verlag, Berlin, DE, Bd. A74, Nr. 3,Mar. 4, 2002, Seiten 339-343, XP002295471.

*Primary Examiner*—Jayprakash N Gandhi
*Assistant Examiner*—Courtney Smith
(74) *Attorney, Agent, or Firm*—Hoffman, Wasson & Gitler, P.C.

(57) ABSTRACT

The invention relates to a novel device made up of a heat source that is formed by at least one electrical or electronic component or is provided with such a component, a heat sink, and an intermediate layer which is located between the heat source and the heat sink and is made of a thermally conducting material. The thermally conducting material is made up of an organic matrix with incorporated nanofibers.

41 Claims, 6 Drawing Sheets

U.S. PATENT DOCUMENTS

| | | | |
|---|---|---|---|
| 6,156,256 A | 12/2000 | Kennel | |
| 6,312,303 B1* | 11/2001 | Yaniv et al. | 445/24 |
| 6,384,960 B1 | 5/2002 | Andrieux et al. | |
| 6,407,922 B1* | 6/2002 | Eckblad et al. | 361/704 |
| 6,542,371 B1* | 4/2003 | Webb | 361/708 |
| 6,663,964 B2* | 12/2003 | Mita et al. | 428/408 |
| 6,706,401 B1* | 3/2004 | Wapner et al. | 428/408 |
| 6,804,105 B2* | 10/2004 | Grigorov et al. | 361/226 |
| 6,815,084 B1* | 11/2004 | Scott et al. | 428/611 |
| 6,821,625 B2* | 11/2004 | Chu et al. | 428/408 |
| 7,118,941 B2* | 10/2006 | Zhang et al. | 438/122 |
| 7,144,624 B2* | 12/2006 | Knowles et al. | 428/364 |
| 7,147,367 B2* | 12/2006 | Balian et al. | 374/44 |
| 7,168,484 B2* | 1/2007 | Zhang et al. | 165/185 |
| 7,180,174 B2* | 2/2007 | Koning et al. | 257/706 |
| 7,303,820 B2* | 12/2007 | Capp et al. | 428/408 |
| 2003/0022428 A1 | 1/2003 | Segal et al. | |
| 2003/0039816 A1 | 2/2003 | Wang et al. | |
| 2003/0077478 A1* | 4/2003 | Dani et al. | 428/673 |
| 2005/0061496 A1* | 3/2005 | Matabayas | 165/185 |
| 2005/0255304 A1* | 11/2005 | Brink | 428/209 |
| 2006/0234056 A1* | 10/2006 | Huang et al. | 428/408 |
| 2006/0270301 A1* | 11/2006 | Marks | 442/316 |
| 2007/0059864 A1* | 3/2007 | Huang et al. | 438/118 |

FOREIGN PATENT DOCUMENTS

| | | |
|---|---|---|
| EP | 1 329 953 | 7/2003 |
| EP | 1 411 549 | 4/2004 |
| JP | 8325195 | 12/1996 |
| WO | WO 01/92381 | 12/2001 |

* cited by examiner

FIG. 4
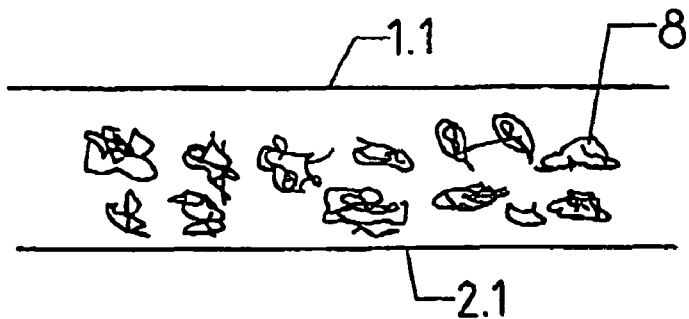
FIG. 5
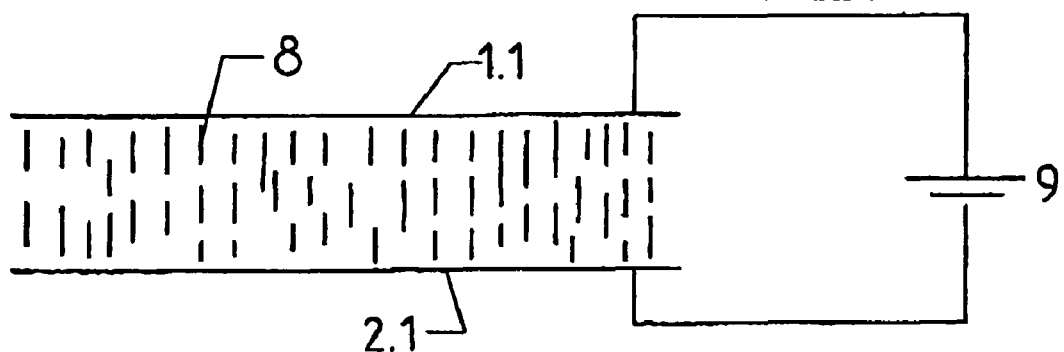
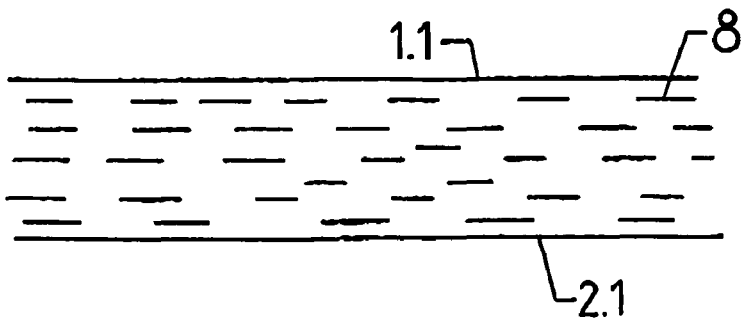
FIG. 6

FIG. 9
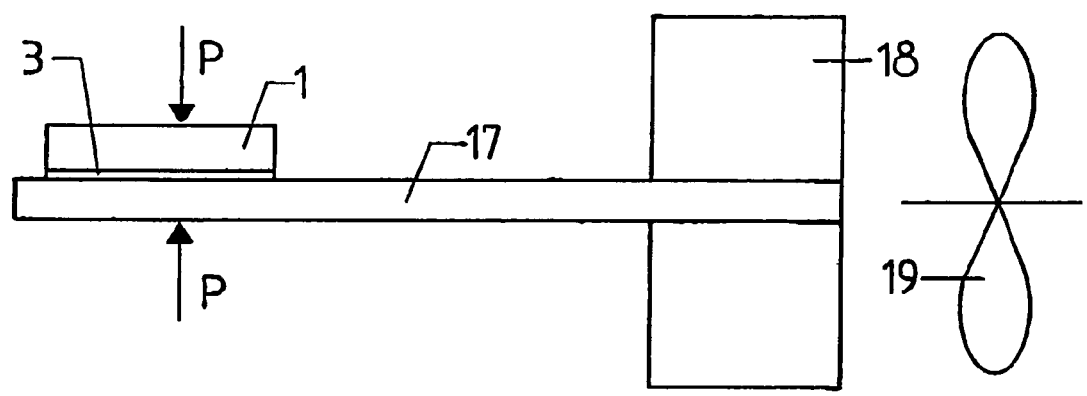
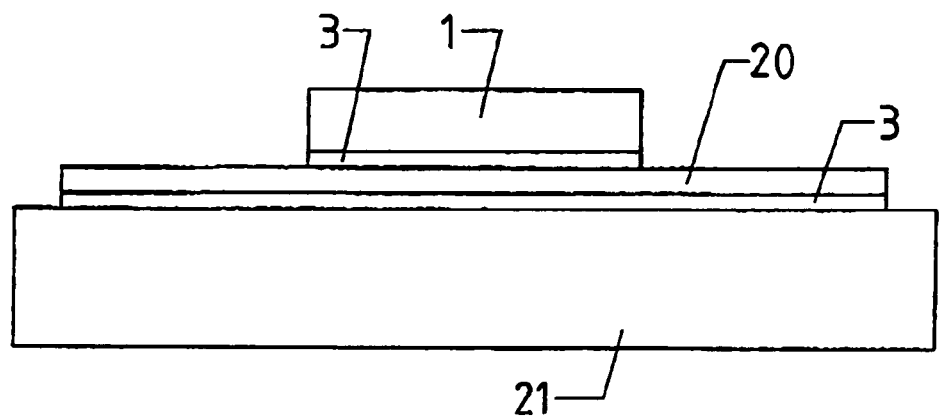
FIG. 10

DEVICE WITH A HEAT SOURCE FORMED BY A FUNCTION ELEMENT THAT IS TO BE COOLED, AT LEAST ONE HEAT SINK, AND AT LEAST ONE INTERMEDIATE LAYER LOCATED BETWEEN THE HEAT SOURCE AND THE HEAT SINK

BACKGROUND OF THE INVENTION

The invention relates to an array or an apparatus and to a thermally conductive mass for the intermediate layer of such an apparatus.

"Heat source" according to the invention generally refers to a part of the apparatus or array containing at least one heat generating function element, for example a corresponding component or assembly. In particular, "heat source" according to the invention refers to an electric or electronic component, to a group of several such components, to an integrated circuit or also to an electric or electronic circuit containing one or more such components or circuits.

"Heat sink" according to the invention refers in general to a part of the apparatus or array according to the invention to which the heat from the heat source is to be transferred in the most optimum manner possible for the purpose of cooling, for example. In particular, "heat sink" according to the invention refers to a part of the apparatus or array according to the invention that serves to cool the electric or electric components or modules.

"Thermally conductive mass" according to the invention refers in particular to a material in a liquid, semi-liquid/viscous or solid state, which as an intermediate layer between the heat source and the heat sink ensures the optimum transfer of heat to the largest surface area possible, also if the corresponding surfaces provided for the transfer of heat (heat transfer surfaces) between the heat source and the heat sink are, for production reasons for example, not completely flat and/or are considerably rough.

Optimum cooling and heat dissipation is essential in electric and electronic components, especially in such components with a high power output or in components containing circuits or modules. Insufficient cooling can result in the destruction of the components and a reduced service life or life time of the corresponding circuit or module. In order to compensate for any uneven and/or rough areas on the adjacent heat transfer surfaces, for example the bottom or cooling surface of a component, an electric or electronic circuit or module and a heat sink (for example a passive or active cooler), normally an intermediate layer consisting of a thermally conductive paste is provided between said heat transfer surfaces. The disadvantage of this method is that after a certain period of operation, many known thermally conductive pastes lose a significant amount of their original thermal conductivity, so that the desired cooling effect of the respective component, circuit or module is lost. This effect is especially pronounced in such applications in which a constant change in the power dissipation and therefore a constant change in temperature occurs during operation, as for example during switching of an electric actuator. In this case, according to an underlying discovery of the invention, the temperature change at the transfer between the heat source (component, circuit or module) and the heat sink apparently causes a mechanical pump effect, with the effect that the thermally conductive paste, and in particular also the components affecting the thermal conductivity of said paste, is concentrated in a reduced surface area, for example in the edge area of the heat transfer surfaces between the heat source and the heat sink, resulting in a severe reduction of the actual surface available for the transfer of heat and therefore in a reduction of the cooling effect.

This problem is compounded by the factor of miniaturization and by ensuing increase of the power density particularly of power modules.

It is an object of the invention to demonstrate an array, arrangement or apparatus that eliminates these disadvantages while enabling the stable transfer of heat between a heat source and a heat sink over an extended period of operation.

SUMMARY OF THE INVENTION

A thermally conductive paste is disclosed that is suitable particularly also for the intermediate layer of the arrangement according to the invention.

Through the nanofibers contained in the organic matrix alone, the intermediate layer present between the heat source and the heat sink or the thermally conductive mass of said intermediate layer has a high thermal conductivity. Moreover, the use of nanofibers also makes said intermediate layer stable over an extended period of operation or use, i.e. especially even with frequent changes in temperature in the proximity of the intermediate layer, there is no change, or at least no noticeable change in said layer. According to an discovery of the invention, the nanofibers therefore have a stabilizing effect on the intermediate layer.

BRIEF DESCRIPTION OF THE DRAWINGS

The invention is described below in detail based on exemplary embodiments with reference to the drawings, wherein:

FIG. 4-6 show an enlarged view of the intermediate layer in the apparatus according to FIG. 1 between the heat source and the heat sink, for different embodiments of the invention; and FIG. 7-11 show various embodiments of an apparatus according to the invention.

DETAILED DESCRIPTION OF THE INVENTION

Figure 1:
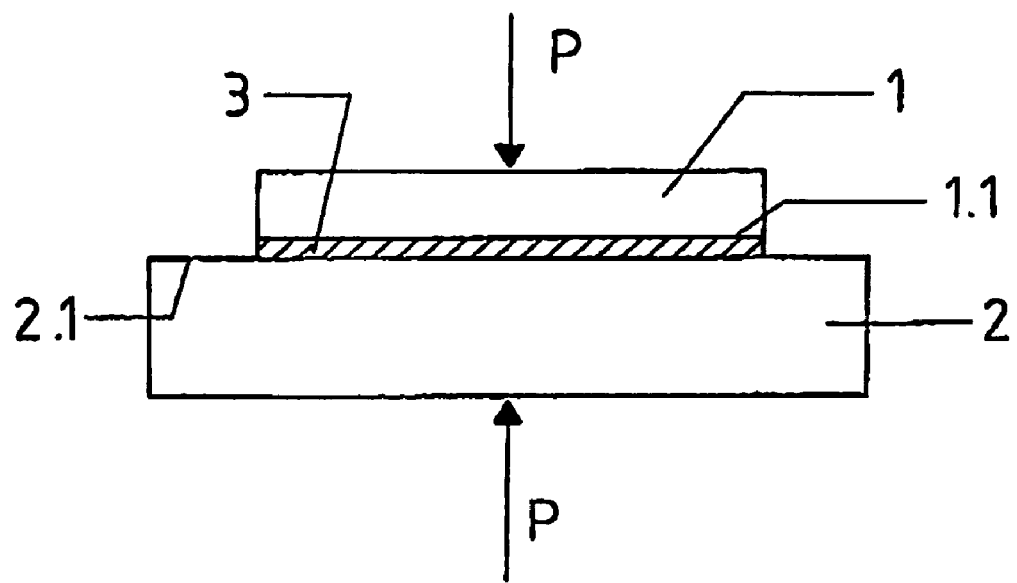
FIG. 1 shows a simplified schematic depiction of the basic structure of an arrangement or apparatus according to the invention.

In FIG. 1, a heat source, the thermal energy of which is dissipated through a heat sink 2, is generally designated 1. The heat source 1 is for example an electric or electronic component, preferably an electric or electronic power component, for example a semiconductor component, e.g. transistor, mosfet, diode, or also a laser diode, integrated circuit, thyristor, laser diode and suchlike, or also an electric or electronic circuit (also module), which comprises one or more electric or electronic components, which generate power loss during operation and therefore must be cooled.

The heat sink 2 can be of any design whatsoever, so that it is suitable for dissipating the thermal output supplied by the heat source 1. The heat source 1 and heat sink 2 are connected with each other in a suitable manner, so that they are immediately adjacent on two essentially flat surface sides 1.1 and 2.1 (heat transfer surfaces). The heat source 1 and heat sink 2 are for example bolted together or connected and pressed together in another manner.

In order to maximize use of the entire surface sides 1.1 and 2.1 for optimum thermal transfer despite unavoidable rough or uneven areas, e.g. due to production, i.e. to minimize the thermal transmission resistance, an intermediate ply or layer 3 made from a material with high thermal conductivity is provided between the heat source 1 and the heat sink 2. The intermediate layer 3 or the material forming said intermediate layer is selected so that, at least during operation of the components generating the heat, a thermal transmission connection with low resistance is created between the heat source 1 and the heat sink 2, also in the uneven areas of the thermal transfer surfaces. Furthermore, the thickness of the intermediate layer 3 is as small as possible, for example so that uneven areas of the surface sides 1.1 and 2.1 are leveled out by said intermediate layer 3.

In the depicted embodiment the thickness of the intermediate layer 3 is between 0.01 and 0.5 mm.

The material used for the intermediate layer 3 consists in the simplest case of at least one organic component as a matrix and of carbon nanofibers embedded in this organic component, for example single-walled nanotubes, double-walled or multi-walled nanotubes or in some other form, for example with fishbone surface structures, which enable optimal integration in the organic matrix.

The nanotubes have a length between 1 μm and 100 μm and a thickness between approximately 1.3 nm and 300 nm, with a ratio of length to thickness of least 10. In a preferred embodiment of the material used for the intermediate layer 3, at least a majority of the nanofibers embedded in the organic matrix have a length greater than 10 μm. The longitudinal orientation of the nanofibers in the intermediate layer is random.

The percentage of nanofibers in the organic matrix between 1 and 70 percent be weight in relation to the overall weight of the material or of the thermally conductive mass, wherein with a percentage between 5 and 20 percent be weight results in excellent properties, in particular with respect to thermal conductivity and stability.

An essential advantage of the intermediate layer 3 is the fact that the use of the nanofibers produces a stable structure for the intermediate layer, i.e. even if the organic matrix at least during operation of the heat source 1 is in a liquid or viscous state, the mass forming the intermediate layer 3 remains stable, i.e. there is no separation or displacement of the nanofibers, for example from the center of the surface sides 1.1 and 2.1 to the edge area, as can be observed with known thermally conductive pastes especially in case of changing temperatures at the heat source. This is obviously due to the fact that the nanofibers are mutually held or fixed in the matrix, in addition to any other additives or components added to the organic matrix.

Various materials or mixtures of materials, which are already liquid at room temperature or close to room temperature, i.e. at temperatures between 10 and 30° C., are suitable for the organic matrix. A suitable material for the organic matrix in this case is for example oil, such as silicone oil. Materials or mixtures of materials, which are liquid in the temperature range of the heat source 1 during operation, i.e. between approximately 40 and 80°, are also suitable for the organic matrix. A suitable material for the organic matrix in this case is for example thermoplastic synthetic material.

As indicated in FIG. 1 by the arrows P, the heat source 1 and the heat sink 2 are pressed against each other through the intermediate layer 3, with a surface pressure between approximately 0.1 and 100 bar.

The use of nanofibers made of carbon in the organic matrix features the advantage of higher thermal conductivity for the intermediate layer 3. With a corresponding percentage of nanofibers, for example as high as 10 percent by weight, the material used for the intermediate layer 3 also displays electrically conductive properties, despite a thermal conductivity that corresponds approximately to the thermal conductivity of aluminum.

Instead of the materials mentioned above, other organic compounds can also be used as matrix components, in particular elastomer organic compounds, such as silicone rubber or also polymers, for example polycarbonate, polypropylene or polyethylene. Especially the use of a matrix made of an elastomer material has the advantage that, due to the elastic design of the intermediate layer 3, changes in the contact pressure P can be compensated at least within certain limits, so that the intermediate layer 3 is in full contact with both surface sides 1.1 and 2.2 at all times within these limits, thus maintaining the desired large-surface thermal transmission. Such changes in the contact pressure P can result for example from changes in the temperature of the heat source 1 and from ensuing changes in length of the elements mutually tensioning against the heat source and the heat sink.

Figure 2:
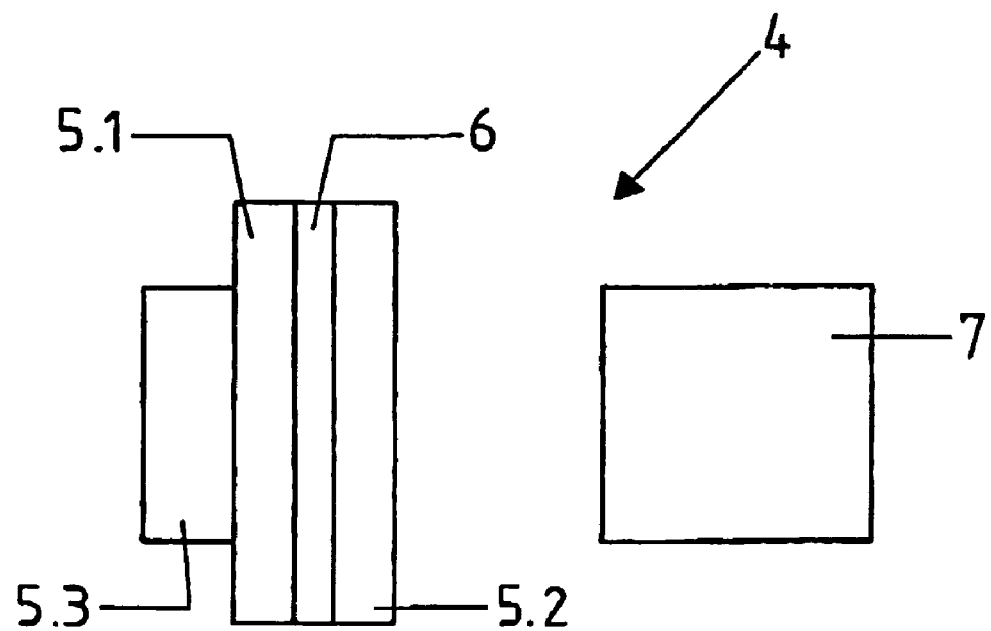
FIG. 2 shows a schematic representation of an apparatus for testing the heat conductivity of the intermediate layer used in the apparatus according to the invention and of the material (thermally conductive paste) used for said layer.

With the test array depicted in FIG. 2, the thermal conductivity of the intermediate layer 3, consisting of a matrix made of silicone oil with a percentage of nanofibers of 10 percent by weight, was tested in relation to the overall mass. The test array generally designated 4 in this drawing consists essentially of two square metal plates 5.1 and 5.2 made of aluminum. Each of the two plates has an edge length of 5 cm and a thickness of 0.2 m and the plates are parallel and at a distance from each other, with a gap 6 of 150 μm. On the surface side of the plate 5.1 facing away from the plate 5.2 there is an electric heating device 5.3, with a power output of 1.2 watts. The plate 5.2 is blackened on its surface side facing away from the plate 5.1 so that the temperature of the plate 5.2 can be measured by contactless measuring by means of an infrared camera 7.

Figure 3:
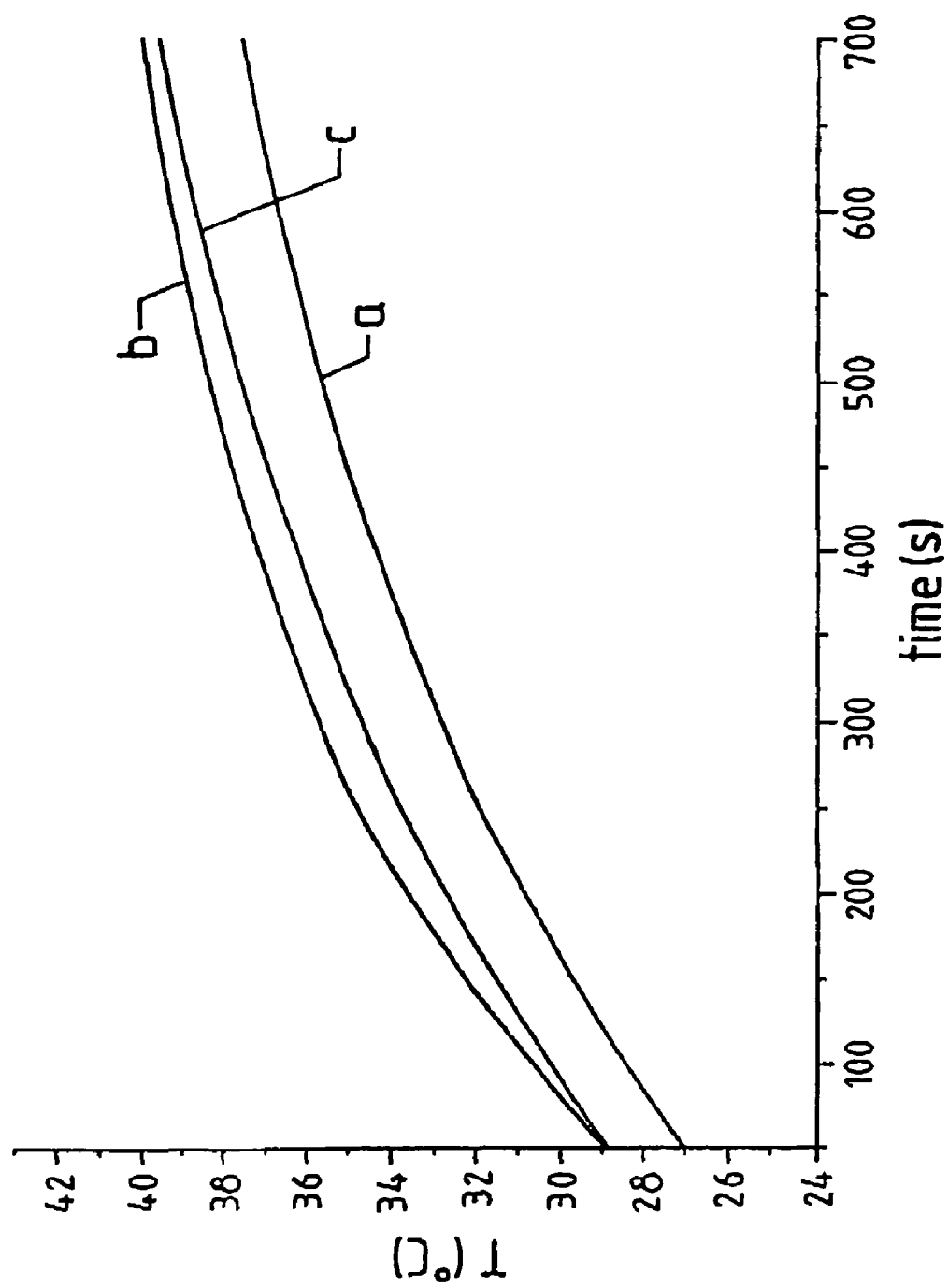
FIG. 3 shows a graphic representation of the change in temperature of a sample heated through the intermediate layer according to the invention, together with the temperature gradient for comparison measurements.
Figure 7:
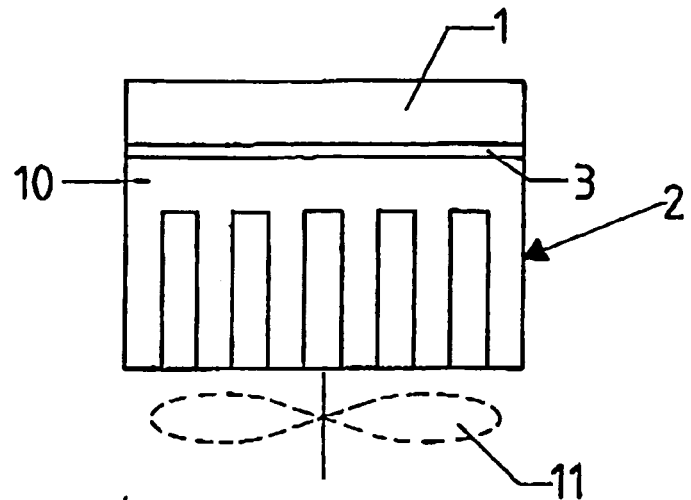

FIG. 3 depicts the temporal gradient of the temperature measured with the infrared camera 7, with curve a providing that there is an air gap 6 of 150 μm between the two plates 5.1 and 5.2, with curve b providing that the gap 6 is filled with pure aluminum, and with curve c providing that the gap 6 is bridged by the material of the intermediate layer 3, i.e. by a paste consisting of the organic matrix of silicone oil with a percentage of carbon nanofibers of 10 percent by weight.

As shown in FIG. 3, curve c very nearly approximates curve b and also progresses clearly above curve a, which confirms the advantageous high thermal coefficients of the mass consisting of the organic matrix and the nanofibers.

Through a suitable treatment of the nanofibers, namely through a graphitizing step at a temperature between approximately 2700 and 3100° C., the thermal conductivity of the nanofibers and therefore the thermal conductivity of the mass containing said nanofibers can be further improved.

It was assumed above that the mass forming the intermediate layer 3 consists only of the organic matrix and the added nanofibers. Further components or additives are conceivable, for example thermally conductive ceramics in powder form, for example $Al_2O_3$, Aln, BN, $Si_3N_4$, SiC, BeO, ZrO. Instead of these or in addition to these, further additions or components are possible, for example in the form of metal particles, e.g. of silver, copper, gold or of alloys of these metals. In particular, metal particles or particles made of metal alloys can be use as additives, which (particles) change into molten state at temperatures above 50° C.

In a further possible embodiment the nanofibers contained in the organic matrix are coated at least partially with at least one metal or one metal alloy, for example electrically or electrolytically and/or chemically coated.

FIG. 4 shows again in an enlarged partial representation the intermediate layer 3 consisting of the organic matrix and the nanofibers 8 embedded in this matrix, in addition to any other additives or components. The nanofibers designated 8 in FIG. 4 are depicted so that they are embedded in the matrix in tangled or crumpled form.

FIG. 5 shows in a depiction similar to FIG. 4 the intermediate layer 3 in a further possible embodiment, wherein the nanofibers 8 at least for the most part are oriented longitudinally so that they are perpendicular or approximately perpendicular to the surface sides 1.1 and 2.1. This is achieved for example by the fact that an electric voltage, for example the voltage of a DC source 9, is applied to the surface sides 1.1 and 2.1 made of electrically conductive material and functioning as electrodes. The voltage is selected so as to produce an electric field intensity of approximately 1 volt per μm within the intermediate layer 3. Due to the orientation of the nanofibers 8, the thermal conductivity of the intermediate layer 3 is improved significantly. Furthermore, the voltage also results in additional stabilization. In a practical embodiment, this low electrical field intensity within the intermediate layer 3 can easily be achieved, for example, by a corresponding difference in potential between the heat source 1 and the heat sink 2.

FIG. 6 shows as a further possible embodiment in a depiction similar to FIG. 4 the intermediate layer 3, in which the nanofibers 8 are oriented longitudinally so that they are parallel to the surface sides 1.1 and 2.1.

In deviation from FIGS. 4-6, the nanofibers embedded in the organic matrix can be at least for the most part connected with each other to form a two- or three-dimensional structure, for example in a kind of web or a non-woven material (fleece) or a three-dimensional porous structure or a three-dimensional network or screen.

The following FIGS. 7-10 show various possible embodiments for the heat sink 2. FIG. 7, for example, shows again in a schematic depiction an apparatus according to the invention with the heat source 1 and a heat sink 2a, which is formed by a cooling element or passive cooler 10 with a plurality of cooling fins or pins or pin-like projections on the side facing away from the heat source 1. The cooler 10 is located in the air stream of a blower or fan 11 for the purpose of dissipating the heat.

Figure 8:
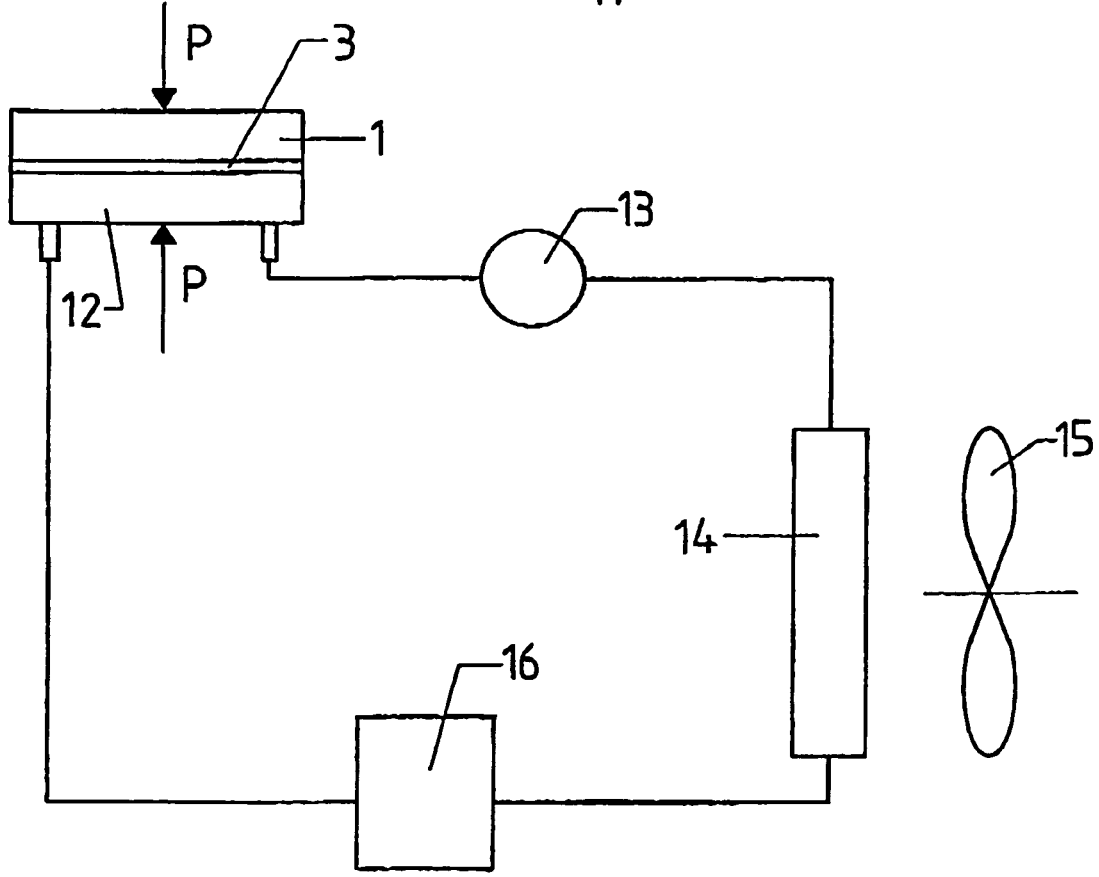

FIG. 8 shows the apparatus according to the invention with a heat sink formed by an active cooler 12. The active cooler 12 is for example a micro-cooler, as described for example in DE 197 10 783 A1. A coolant, for example water or a coolant containing water, circulates through said cooler 12, which for this purpose is located within a cooling circuit, comprising a circulating pump 12, an external recooler 14 with a blower 15 and a compensating or collection tank 16 for the coolant.

FIG. 9 shows an embodiment of the apparatus according to the invention in which the heat sink is formed by a heat pipe 17. Said heat pipe 17 contains in its elongated, hermetically sealed housing a coolant that is vaporizable through heating, for example alcohol or some other vaporizable organic medium. Also within the elongated, sealed housing there are at least two parallel flow paths, which are connected with each other at least at the two ends of the housing, namely one channel-like flow path for the vaporized medium and one capillary-like flow path for the liquid phase of the coolant.

The heat source 1 is connected via the intermediate layer 3 to one end of the heat pipe 17. On the other end of the heat pipe 17 there is a cooler 18, comprising for example a plurality of cooling fins or corresponding projections or pins, which (cooler) is located within the air stream of a blower 19.

FIG. 10 shows as a further possible embodiment an apparatus according to the invention in which the heat sink 2 is formed by one heat pipe 20 serving as a heat spreader and one cooler 21 corresponding to the cooler 10. The cooler 21 is likewise located within the air stream of a blower not depicted or the cooler 21 is designed corresponding to the cooler 12 as an active cooler through which a coolant circulates, for example as a micro-cooler. The heat pipe 20 corresponds in its function to the heat pipe 17, however with the difference that the area where the heat source 1 is provided is located in the center of the housing of the heat pipe 20, so that the latter is symmetrical at least in relation to a plane oriented perpendicularly to the surface side 1.1 of the heat source 1.

One intermediate layer or intermediate ply corresponding to the intermediate layer 3 is provided both between the heat source 1 and the top of the heat pipe 20 and between the bottom of this heat pipe and the adjacent surface of the cooler 21. Furthermore, in all embodiments depicted in FIGS. 7-10, the components located on both sides of the respective intermediate layer 3 are pressed together in the manner described above, namely with a surface pressure between 0.1 and 100 bar.

Figure 11:
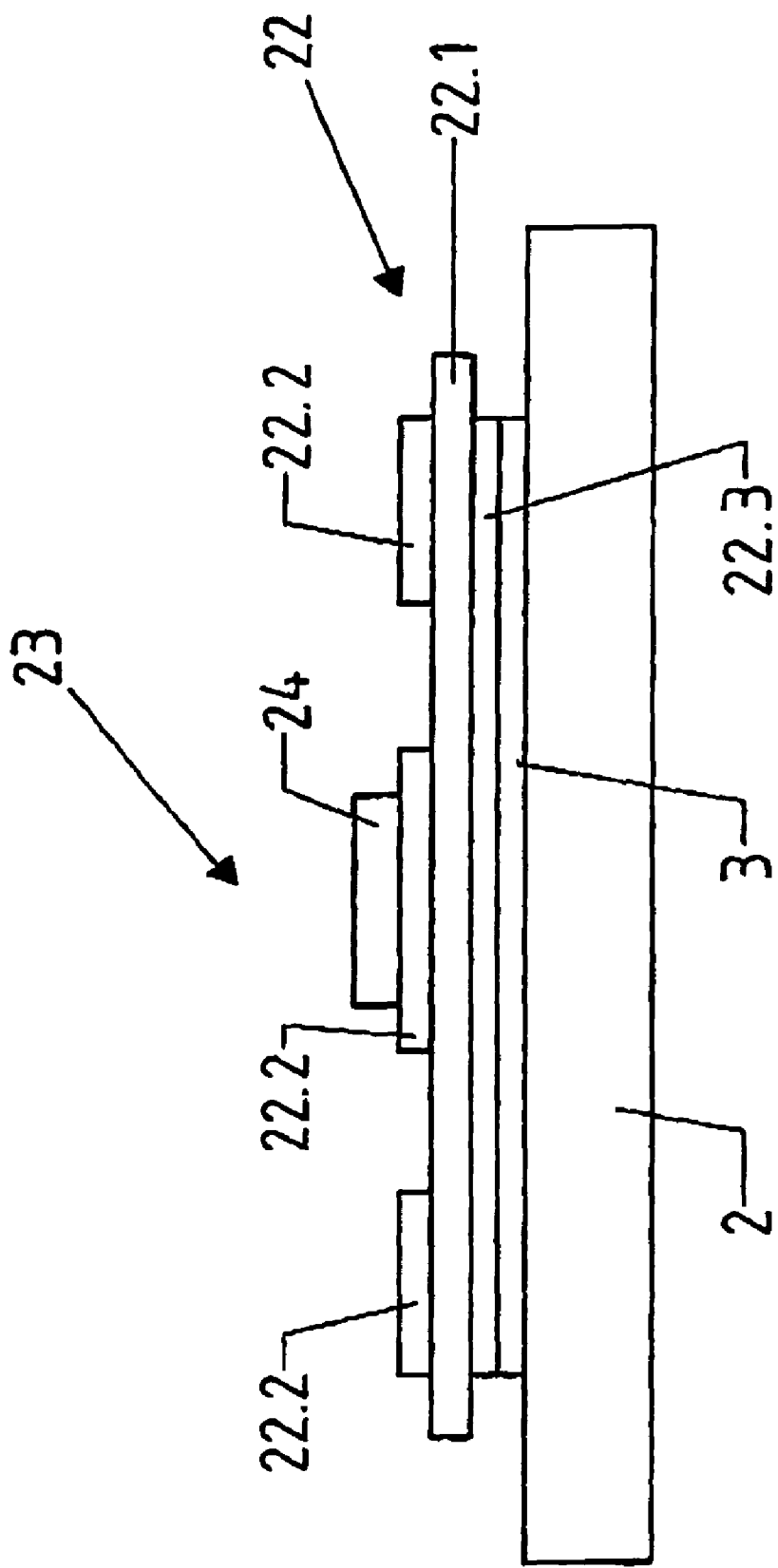

FIG. 11 shows an embodiment in which an electronic circuit 23 is provided using a ceramic-metal substrate, preferably a copper-ceramic substrate, on the heat sink again generally designated 2 in this drawing. Said electrical circuit is at least one electrical or electronic power component 24, for example a diode, a semiconductor switching or control element, such as a transistor (or also a mosfet), thyristor, etc. or a laser diode. The substrate 22 consists in the known manner of a ceramic layer, for example an aluminum oxide or aluminum nitride ceramic, and is provided by means of the likewise known DCB or active soldering process on both sides with a metallization formed by a metal foil, for example copper foil. The upper metallization 2.2 is structured to form strip conductors, contact surfaces, etc. The power component 24 is also affixed to this metallization, for example by means of soldering. The lower metallization 22.3 is used for heat spreading and cooling and is connected via the intermediate layer 3 with the heat sink 2, which likewise can be designed in any manner corresponding to the respective application, for example as described above in connection with FIGS. 7-10.

The invention was described above based on exemplary embodiments. It goes without saying that numerous modifications and variations are possible without abandoning the underlying inventive idea on which the invention is based.

REFERENCE MARKS 1 heat source
1.1 heat transfer surface or surface side of the heat source
2 heat sink
2.1 heat transfer surface of surface side of the heat sink
3 intermediate ply of layer
4 measuring or testing set-up
5.1, 5.2 aluminum plate
5.3 electric heating device on plate 5.1
6 clearance
7 infrared camera for contactless temperature measuring
8 nanofiber
9 voltage source
10 passive cooling element 11 blower
12 active cooler
13 circulating pump
14 recooler
15 blower
16 compensating tank
17 heat pipe
18 cooling element
19 blower
20 heat pipe as heat spreader
21 cooler
22 metal-ceramic substrate
22.1 ceramic layer
22.2, 22.3 metallization
23 electric or electronic circuit
24 electric or electronic power component
a, b, c temporal temperature gradient

The invention claimed is:

1. An apparatus with a heat source comprising at least one electric or electronic component, with a heat sink and with an intermediate layer made of a thermally conductive material provided between the heat source and the heat sink, wherein the intermediate layer consists of an organic matrix with embedded nanofibers, the length of at least a majority of the nanofibers embedded in the organic matrix is between 1-100 μm and wherein the heat source and the heat sink bear with thermally conductive surfaces against the intermediate layer with a surface pressure between approximately 0.1 and 100 bar, wherein the organic matrix is already in the viscous or liquid state at a temperature between 10 and 30° C. and is in the viscous state or the liquid state at an operating temperature of the apparatus higher than 30° C. or at a temperature between 40° C. and 80° C.; and wherein the percentage of nanofibers in the matrix is between 5 and 20 percent by weight in relation to the total mass of the intermediate layer, and wherein a length/thickness ratio of a majority of the nanofibers embedded in the organic matrix is greater than 10, and wherein the thickness of the intermediate layer is between 0.01 mm and 0.5 mm.

2. The apparatus according to claim 1, wherein the organic matrix contains at least one oil, such as a synthetic oil, or a silicone oil.

3. The apparatus according to claim 1, wherein the organic matrix contains at least partially an elastomer, such as a completely or only partially cross-linked elastomer, or a synthetic elastomer, or silicone rubber.

4. The apparatus according to claim 1, wherein the organic matrix is at least partially a polymer, a polycarbonate, a polypropylene or a polyethylene.

5. The apparatus according to claim 1, wherein at least part of the nanofibers are made of carbon, boron nitride, or tungsten carbide.

6. The apparatus according to claim 1, wherein the nanofibers in the organic matrix are oriented in a random and/or tangled configuration.

7. The apparatus according to claim 1, wherein the nanofibers in the organic matrix at least for the most part are oriented in the same direction longitudinally, perpendicular or crosswise to the adjacent heat transfer surfaces or parallel or approximately parallel to the heat transfer surfaces.

8. The apparatus according to claim 7, further comprising means for orienting and/or maintaining the orientation of the nanofibers in the organic matrix, by means for creating an electric field intensity in the organic matrix.

9. The apparatus according to claim 1, wherein at least part of the nanofibers embedded in the organic matrix form a two-dimensional or three-dimensional structure, in which the nanofibers are linked with each other, in the form of a web or web-like structure, a non-woven material structure and/or a network or screen-like structure.

10. The apparatus according to claim 1, wherein the organic matrix contains further components or additives in a percentage that is lower than the percentage of nanofibers.

11. The apparatus according to claim 10, wherein the organic matrix contains at least one thermally conductive ceramic in the form of fine particles or powder as an additive, selected from $Al_2O_3$, AlN, BN, $Si_3N_4$, SiC, BeO, ZrO.

12. The apparatus according to claim 10, wherein the organic matrix contains as an additive at least one metal and/or metal compound and/or metal alloy in the form of fine particles or powder, selected from silver, copper or gold.

13. The apparatus according to claim 10, wherein the matrix contains as an additive, in the form of fine particles or powder, at least one material and/or material compound and/or alloy that is heat-conductive and changes to molten state at temperatures above 50° C.

14. The apparatus according to claim 1, wherein at least part of the nanofibers are nanotubes, for example single-walled and/or double-walled nanotubes.

15. The apparatus according to claim 1, wherein at least part of the nanofibers are coated with at least one metal.

16. The apparatus according claim 1, wherein the nanofibers made of carbon are such nanofibers that were subjected to a heat treatment or graphitization step at a temperature between 2700-3100° C. before being embedded in the organic matrix.

17. The apparatus according to claim 1, wherein the heat source is formed by at least one electronic component, such as diode, semiconductor switch or control element, a transistor, a mosfet or by an integrated component.

18. The apparatus according to claim 1, wherein the heat source is formed by at least one circuit or module with at least one electric or electronic component, which is located on a metal-ceramic substrate manufactured using the DCB process or active soldering process, wherein the intermediate layer is located between one metallization of the substrate and one heat transfer surface adjacent to said metallization.

19. The apparatus according to claim 1, wherein the heat source is formed by a microprocessor, at least one laser diode or one laser diode bar.

20. The apparatus according to claim 1, wherein the heat sink is formed by a passive cooler with cooling fins, cooling pins or similar structures.

21. The apparatus according to claim 1, wherein the heat sink comprises at least one active cooler through which a coolant circulates.

22. The apparatus according to claim 21, the at least one cooler is part of a coolant circulation system.

23. The apparatus according to claim 1, wherein the heat sink comprises at least one heat pipe and that the intermediate layer is provided at least between the heat source and one cooling surface formed by the heat pipe.

24. The apparatus according to claim 23, wherein one cooler or heat exchanger is provided on the heat pipe, wherein at least one intermediate layer is provided between the heat pipe and this heat exchanger or cooler.

25. The apparatus according to claim 23, wherein the heat pipe functions as a heat pump or heat spreader.

26. A thermally conductive mass for forming an intermediate layer between a heat source and a heat sink wherein the mass consists of an organic matrix with embedded nanofibers and the length of at least for a majority of the nanofibers embedded in the organic matrix is between 1-100 μm, wherein the organic matrix is already in the viscous or liquid state at a temperature between 10 and 30° C. and is also in the viscous state or in a liquid state at a temperature higher than 30° C. or at a temperature between 40 and 80° C., and wherein the percentage of nanofibers in the matrix is between 5 and 20 percent by weight in relation to the total mass of the intermediate layer and wherein the nanofibers have a thickness between approximately 1.3 nm and 300 nm, wherein the length/thickness ratio of a majority of the nanofibers embedded in the organic matrix is greater than 10, and wherein the thickness of the intermediate layer is between 0.01 mm and 0.5 mm.

27. The thermally conductive mass according to claim 26, wherein the organic matrix, at least at the operating temperature of the apparatus or of the heat source, is in a viscous or liquid state, or a semi-liquid state.

28. The thermally conductive mass according to claim 26, wherein the organic matrix contains at least one oil, a synthetic oil, or a silicone oil.

29. The thermally conductive mass according to claim 26, wherein the organic matrix contains at least partially an elastomer, a completely or only partially cross-linked elastomer, a synthetic elastomer or a silicone rubber.

30. The thermally conductive mass according to claim 26, wherein the organic matrix is at least partially a polymer, selected from polycarbonate, polypropylene or polyethylene.

31. The thermally conductive mass according to claim 26, wherein at least part of the nanofibers are made of carbon, boron nitride and/or tungsten carbide.

32. The thermally conductive mass according to claim 26, wherein the nanofibers in the organic matrix are oriented in a random and/or tangled configuration.

33. The thermally conductive mass according to claim 26, wherein the nanofibers in the organic matrix at least for the most part are oriented in the same direction longitudinally perpendicular or crosswise to the adjacent heat transfer or parallel or approximately parallel to the heat transfer surfaces.

34. The thermally conductive mass according to claim 26, wherein at least part of the nanofibers embedded in the organic matrix form a two-dimensional or three-dimensional structure, in which the nanofibers are linked with each other, in the form of a web or web-like structure, a non-woven material structure and/or a network or screen-like structure.

35. The thermally conductive mass according to claim 26, wherein the organic matrix contains further components or additives, in a percentage that is lower than the percentage of nanofibers.

36. The thermally conductive mass according to claim 35, wherein the organic matrix contains as an additive at least one thermally conductive ceramic in the form of fine particles or powder, selected from $Al_2O_3$, AlN, BN, $Si_3N_4$, SiC, BeO, ZrO.

37. The thermally conductive mass according to claim 35, wherein the organic matrix contains as an additive at least one metal and/or metal compound and/or metal alloy in the form of fine particles or powder, such as silver, copper or gold.

38. The thermally conductive mass according to claim 35, wherein the matrix contains as an additive, in the form of fine particles or powder, at least one material and/or material compound and/or alloy that is heat-conductive and changes to molten state at temperatures above 50° C.

39. The thermally conductive mass according to claim 26, wherein at least part of the nanofibers are nanotubes, single-walled and/or double-walled nanotubes.

40. The thermally conductive mass according to claim 26, wherein at least part of the nanofibers are coated with at least one metal.

41. The thermally conductive mass according to claim 26, wherein the nanofibers made of carbon are such nanofibers that were subjected to a heat treatment or graphitization step at a temperature between 2700-3100° C. before being embedded in the organic matrix.

\* \* \* \* \*